United States Patent
Crisp et al.

(10) Patent No.: US 7,317,249 B2
(45) Date of Patent: Jan. 8, 2008

(54) MICROELECTRONIC PACKAGE HAVING STACKED SEMICONDUCTOR DEVICES AND A PROCESS FOR ITS FABRICATION

(75) Inventors: Richard Dewitt Crisp, Castro Valley, CA (US); Belgacem Haba, Cupertino, CA (US); Giles Humpston, San Jose, CA (US)

(73) Assignee: Tessera, Inc., San Jose, CA (US)

( * ) Notice: Subject to any disclaimer, the term of this patent is extended or adjusted under 35 U.S.C. 154(b) by 317 days.

(21) Appl. No.: 11/021,627

(22) Filed: Dec. 23, 2004

(65) Prior Publication Data

US 2006/0138647 A1    Jun. 29, 2006

(51) Int. Cl.
*H01L 23/34* (2006.01)
(52) U.S. Cl. .................... 257/723; 257/778
(58) Field of Classification Search ............ 257/723, 257/778, 686
See application file for complete search history.

(56) References Cited

U.S. PATENT DOCUMENTS

| | | | |
|---|---|---|---|
| 5,909,634 | A | 6/1999 | Hotchkiss et al. |
| 6,303,407 | B1 | 10/2001 | Hotchkiss et al. |
| 6,452,259 | B2 | 9/2002 | Akiyama |
| 6,476,503 | B1 | 11/2002 | Imamura et al. |
| 2002/0008309 | A1 | 1/2002 | Akiyama |
| 2004/0238857 | A1 | 12/2004 | Beroz et al. |
| 2006/0138647 | A1* | 6/2006 | Crisp et al. .......... 257/723 |

FOREIGN PATENT DOCUMENTS

EP    1 458 024 A    9/2004

* cited by examiner

*Primary Examiner*—Mark V. Prenty
(74) *Attorney, Agent, or Firm*—Lerner, David, Littenberg, Krumholz & Mentlik, LLP

(57) ABSTRACT

A packaged microelectronic device having a first and second electrically interconnected microelectronic elements and a method for its manufacture. Conductive posts extend from one major surface of the first microelectronic element. The first microelectronic element is electrically interconnected to the second microelectronic element via the conductive posts. The first microelectronic element preferably has an interposer element from which the conductive posts extend. The second microelectronic element is interconnected to the interposer element via contacts on the second microelectronic element via the conductive posts. The so interconnected microelectronic elements have coordinated functionality, such as a programmable logic device wherein one microelectronic element is a field programmable gate array and the other microelectronic element is a memory device. The packaged microelectronic device is formed by using a transfer substrate to transfer solder masses onto at least some of the conductive posts extending from the first major surface of the first microelectronic element or contacts on the second microelectronic element. The solder masses are then used to electrically interconnect the conductive posts with the contacts disposed on the surface of the second microelectronic element.

17 Claims, 8 Drawing Sheets

MICROELECTRONIC PACKAGE HAVING STACKED SEMICONDUCTOR DEVICES AND A PROCESS FOR ITS FABRICATION

BACKGROUND OF THE INVENTION

This invention relates to a packaged, microelectronic device having a plurality of microelectronic elements in the form of integrated circuit chips in a stacked relationship with each other.

In integrated circuit devices, it is at times desired to form a packaged device that has one smaller semiconductor die or chip attached to and interconnected with another semiconductor die or chip. Such packaged devices are often referred to as stacked-chip packaged devices. Such packages are desirable and find many applications. One such application is in programmable logic devices (PLDS). For example, it is desirable to add memory to a logic chip such as a digital signal processor (DSP) chip, a central processing unit (CPU) chip or a field programmable gate array (FPGA) chip.

Figure 1:
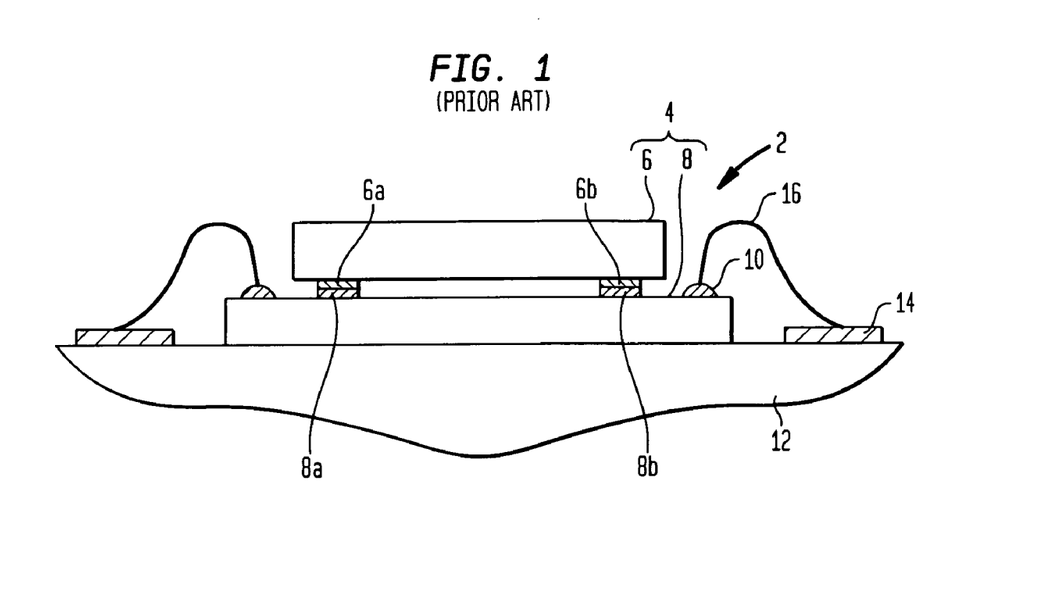
FIG. 1 is a cross-section of a prior art stacked chip package.

U.S. Pat. No. 6,452,259 to Akayama describes such an LSI (large scale integration) integrated circuit device. Referring to FIG. 1, a cross-section of an LSI device is illustrated. The LSI 2 is a stacked chip 4 supported by package substrate 12. The stacked chip 4 is a single body that consists of a first chip 8 laminated to a second chip 6. In one example, the first chip 8 has a field programmable gate array (FPGA) function and the second chip has a central processing unit (CPU) function. First chip 8 is electrically interconnected to second chip 6 by bonding together opposing contacts 6a and 8a, and 6b and 8b. On the periphery of larger chip 8 there are a plurality of contact pads 10. Through these contacts, interconnection between the LSI and other devices is achieved.

The stacked chips 6 and 8 are supported by a package 12. A pad 14 on package 12 is interconnected with the pad 10 on the chip 8 by the bonding wire 16. In addition to being supported by package 12, the stacked chip structure 4 and the bonding wire 16 are sealed by a material such as epoxy resin.

The advantages of forming such LSI devices are numerous. First, such devices have the footprint of a single device and thus take up less area when placed on a circuit board and assembled with other components. Also, by being interconnected in the stacked configuration in a single package, communication delays that would result if the chips were packaged separately from one another and interconnected in a more conventional manner (e.g. traces on a printed circuit board) are avoided.

However, such devices present many packaging challenges. Chief among them is the challenge of accurately interconnecting the contacts of the chips. This is due to the extremely fine pitch between contacts. Thus, while stacked chip packaging continues to be viewed as an attractive way to package PLDS, improvements in methods for achieving interconnection between the chips is sought.

SUMMARY OF THE INVENTION

A first microelectronic element is supported by and interconnected with a second microelectronic element. The interconnected first and second microelectronic elements are referred to herein as an element assembly. At least one of the first and second microelectronic elements has associated therewith a plurality of conductive posts. The conductive posts are electrically interconnected to the microelectronic element and extend from a first surface thereof. In the microelectronic assembly, the surface from which the conductive posts extend is facing toward the other microelectronic element in the assembly.

It is advantageous if the first microelectronic element from which the conductive posts extend is a combination of an integrated circuit device (i.e. an integrated circuit chip referred to as a chip hereinafter) with standard contacts and an interposer interconnect element with the conductive posts extending therefrom. Chips are also referred to as die or bare die. The chip contacts are electrically interconnected to contacts on the interposer interconnect element. The interposer has conductive traces that electrically connect the chip contacts to the conductive posts. By using such an interposer element, the pitch of the conductive posts can be selected to match the pitch of the contacts of the second microelectronic element in the assembly (i.e. the microelectronic element to which the chip/interposer combination is electrically connected). The second microelectronic element is also referred to as a second chip hereinafter.

The interconnect interposer element can be used to compensate for all manner of inaccuracies and errors that arise during the manufacture of the chips in the assembly. For example, the pitch of the contacts on the two chips, even if intended to be the same, can be different. Thermal gradients or the chips being made of different semiconductor materials (III-V (e.g. GaAs) vs. silicon) can stress the contacts between the two chips when the element assembly is subjected to a change in temperature, thereby causing those contacts to become misaligned. Also, the manufacturing process can cause the surface of a chip to be less than completely and perfectly planar, leading to some topography on the surface. Due to this topography, the chip contacts may not be completely coplanar. The interposer element is adaptable and can adjust to accommodate the above-identified non-uniformities and still achieve the desired interconnection between the two chips. This adjustability is achieved by using a flexible material for the interposer substrate.

A chip/interposer combination is described in the above-identified commonly-assigned U.S. Patent Application Provisional Ser. No. 60/533,210 to Haba et al., which is entitled "Microelectronic Packages and Methods Therefor," and incorporated by reference.

It is also advantageous if the conductive posts of the interposer element terminate in solder balls. The solder balls are then used to electrically interconnect the conductive posts of the chip/interposer combination to the other chip.

In this regard, it is advantageous if the solder balls are affixed to the conductive posts or the contacts for the second chip according to the method described in commonly-assigned U.S. patent application Ser. No. 10/993,962, filed Nov. 19, 2004, which is entitled "Solder Ball Formation and Transfer Method," and is hereby incorporated by reference. In this method, the solder paste, which contains a carrier and a solder, is deposited on a transfer substrate that is not substantially wettable by the solder itself; but is wettable by one of the solder paste constituents (e.g. the solder flux). Thus, the solder paste remains where it is placed on the transfer substrate because the transfer substrate is wettable by a constituent of the solder paste. Yet the solder paste is easily transferred because the transfer substrate is not wetted by the solder itself.

The solder balls are formed on the transfer substrate by applying the solder paste to the transfer substrate and then heating the solder paste to its reflow temperature. This reflow step causes the solder paste to flow and coalesce into a solder "mass." Conditions for reflow are controlled so that discrete solder masses are formed in a desired pattern. That desired pattern corresponds to the pattern of conductive posts on that interposer element or first chip or the contacts on the second chip.

Once reflow is achieved, the solder masses on the transfer substrate are aligned with the conductive posts on the interposer element or the chip or the contacts on the second chip. Alignment is achieved using the methods described in the above-identified application entitled "Solder Ball Formation and Transfer Method". Alignment is easily achieved due to the fact that the transfer substrate is made of glass and is therefore transparent.

DETAILED DESCRIPTION

Figure 2A:
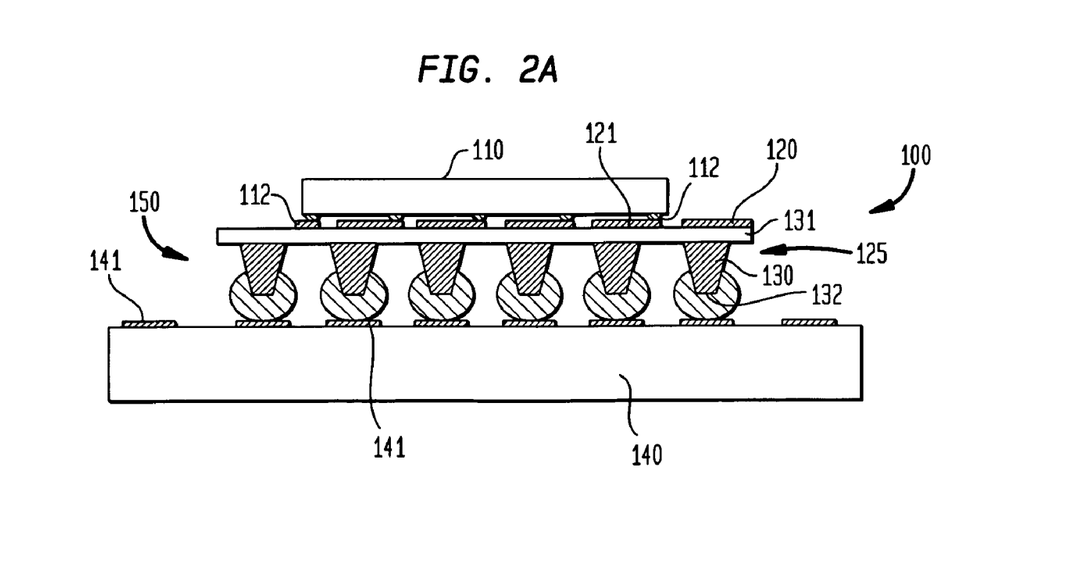
FIGS. 2A-2C are cross-sections of a two-stacked chip package according to embodiments of the present invention depicting different configurations for the interposer/first chip interconnect.

In one embodiment of the present invention a first microelectronic element is attached and electrically interconnected to a second microelectronic element. The microelectronic elements can be the same size or a different size. In the described embodiment the first microelectronic element has a smaller footprint (i.e. area) than the second microelectronic element. In one embodiment, the first microelectronic element is an assembly of a first integrated circuit device (i.e. chip) and an interposer element. This embodiment is described with reference to FIG. 2. A cross section of the packaged device 100 has a first smaller chip 110 attached to an interposer element 125. The interposer element 125 has a substrate 120 that is made of a dielectric material that, preferably, has a low modulus of elasticity, e.g., about 5 GPa or less and a large elastic range. For purposes of the present invention, a large elastic range is where the strain to failure induced by deformation (i.e. stretch) is at least fifty percent. Polyimide is one example of a material that has suitable dielectric properties and can be configured to satisfy these parameters. Other polymer-based dielectric materials that have these properties are well known to one skilled in the art and an exhaustive list of such materials is not provided herein.

The interposer element 125 also has conductive posts 130 extending therefrom. The conductive posts 130 are electrically conductive. The interposer element 125 and small chip 110 are interconnected such that the conductive posts 130 are electrically connected to contact pads 112 on small chip 110. Conductive traces 121 are provided in interposer element 125 to effect the desired electrical interconnection between the conductive posts 130 and the small chip 110.

A conductive post is distinct from a contact. Specifically a conductive post projects a distance from the surface of the body or the interposer element that exceeds the thickness of a contact or metal trace. The dimensions of the conductive posts can vary over a wide range, but typically the conductive posts extend about 50 μm to about 300 μm from the surface of the body or the interposer element. The base of the posts typically are about 100-600 μm in diameter. Thus, the profile of conductive posts are quite distinct from the profile of a standard contact.

The length and diameter of the conductive posts are limited by the pitch of the contacts 141 on large chip 140, the size of the package, size of the small chip 110 and the pitch of the contacts 112 thereon. For this application, in which the posts are incorporated into a stacked package microelectronic element, the posts typically will extend from the surface of interposer element 125 a distance in the range of about 50 μm to about 300 μm. In a preferred embodiment, the conductive posts 130 have a frustoconical configuration which is illustrated in FIG. 2. In that configuration, the conductive posts 130 have a base end 131 and a tip end 132, both of which are substantially circular. For example, and not by way of limitation, the base has a diameter in the range of about 100 μm to about 600 μm. The tip has a diameter in the range of about 40 μm to about 200 μm. The posts are preferably metallic, examples of which include, copper, copper alloys, gold and combinations thereof. For example, the posts can be formed principally from copper with a layer of gold formed thereon.

Figure 3:
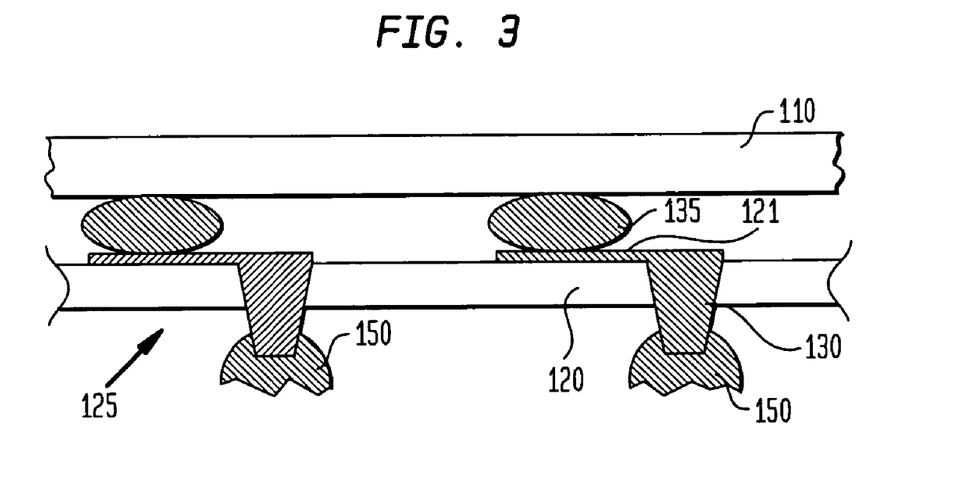
FIG. 3 is a detail view of the region circled in FIG. 2.

A portion of packaged device 100 is magnified in FIG. 3. Because the interposer element substrate 120 is made of a flexible dielectric material, it is advantageous if support elements 135 are provided between small chip 110 and the interposer element 130. The support elements extend from the small chip 110 and engage traces 121 on the interposer element 125. The traces 121 are configured to electrically interconnect at least some of the support elements with the conductive posts 130.

It is advantageous if the support elements 135 are offset from the contact posts 130. The offset relationship is best understood with reference to FIG. 3. There it can be seen that the support elements 135 are not directly aligned with conductive posts 130. Rather, the support elements 135 are offset some distance from the conductive posts 130. Electrical interconnection between the conductive posts 130 and the support elements 135 is achieved by conductive traces 121. Various examples of suitable offset patterns for the conductive posts 130 and support elements 135, and how to determine such patterns, are provided in previously-identified U.S. Provisional Application Ser. No. 60/533,210.

Figure 2B:
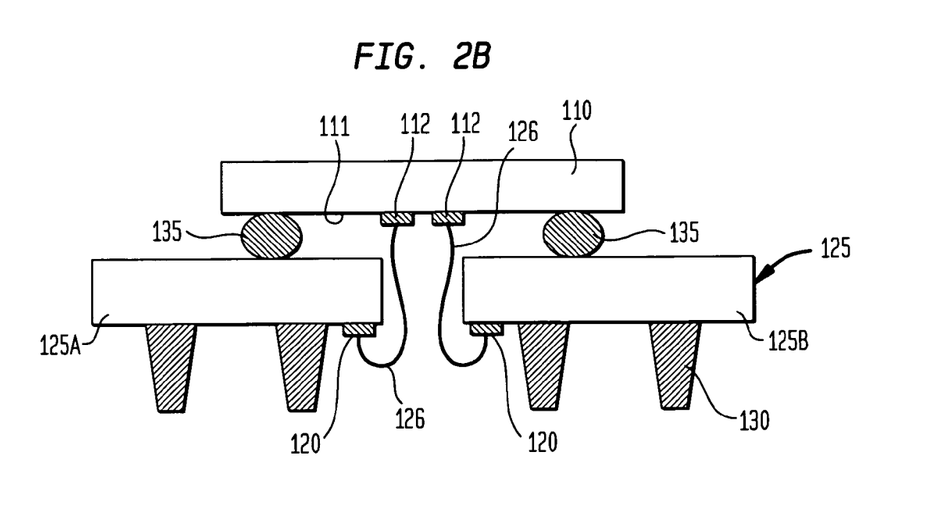

Referring to FIG. 2B, the interposer element 125 is illustrated in two parts, 125A and 125B. Support elements 135 are sandwiched between interposer elements 125A and 125B and small chip 110. Electrical interconnection between small chip 110 and the interposer element 125 is achieved via wires 126. Wires 126 are in electrical contact with contact pads 112 on the contact face 111 of small chip 110.

Figure 2C:
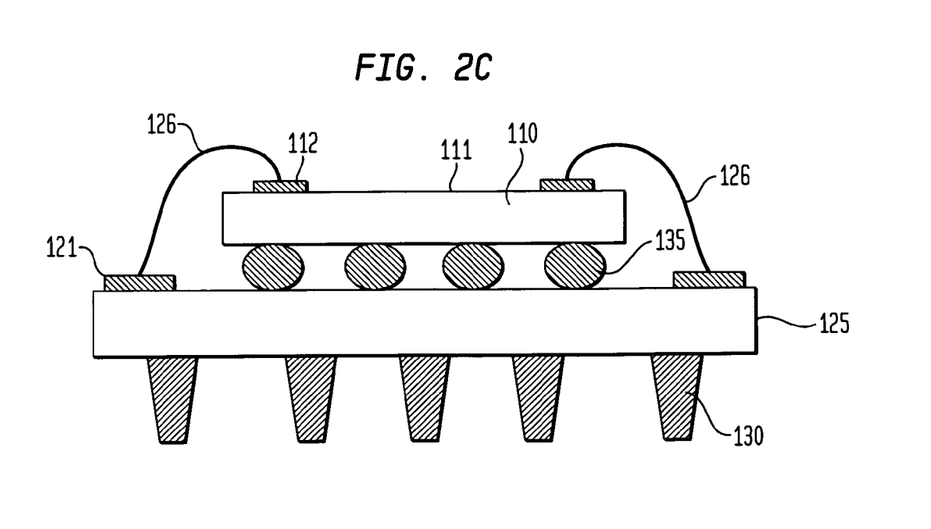

In yet another embodiment, depicted in FIG. 2C, the contact face 111 of small chip 110 is facing away from interposer element 125. Wires 126 interconnect contacts 112 on the contact face of small chip 110 with contact traces 121 on the interposer element 125. In the embodiments depicted in FIGS. 2B and 2C wires 126 are affixed to contacts 112 and 121 using standard techniques for wire bonding.

The interposer element 125 can be formed by the process described in co-pending, commonly assigned U.S. Provisional Application Ser. No. 60/508,970, filed on Oct. 6, 2003, the disclosure of which is incorporated by reference herein. Briefly, a metallic plate is patterned using any suitable conventional process such as etching to form a plurality of posts projecting from the plate. A dielectric layer is applied to the post side of the metallic plate. The dielectric layer is formed on the metallic plate by coating the plate with a dielectric such as polyimide. In an alternate approach the posts are forcibly engaged with a dielectric sheet such that the posts penetrate through the sheet. Once the sheet is in place, the metallic plate is etched to form individual traces on the inner side of the interposer element.

In an alternate embodiment, traces on the interposer element may be formed using conventional processes such as plating or etching while the conductive posts can be formed according to the process disclosed in U.S. Pat. No. 6,177,636, which is incorporated by reference herein. In still another alternative embodiment, the conductive posts can be formed as individual elements and assembled to the interposer element or chip in any suitable manner. The conductive posts 130 of the interposer element 125 are electrically connected to the contacts 141 of large chip 140. Solder masses 150 are used to both bond and electrically connect conductive posts 130 with the contact pads 141 on the surface of large chip 140.

The conductive posts 130 terminate in solder masses 150. The method for forming a solder mass on the tips of frustoconical conductive posts 130 is described in the previously identified U.S. Ser. No. 10/993,962. Briefly, the solder is first deposited on a transfer substrate, preferably in paste form. The solder paste contains solder and a carrier, which is typically a solder flux. The solder paste is deposited on the transfer substrate using any known method such as screen printing, syringe, etc.

Once the solder paste is deposited onto the transfer substrate, it is heated or reflowed to form a solder mass (roughly spherical in shape). Conditions required to form these solder masses are well known to one skilled in the art and are not discussed in detail herein. Because the solder paste is formed of discrete masses of solder suspended in flux, the conditions for forming a larger solder mass are selected to cause these discrete masses to coalesce. Discrete masses that do not coalesce into the "ball" are referred to as satellites.

A process for solder ball formation and transfer onto conductive posts is illustrated in FIGS. 4A-4E. In this illustrated embodiment, the interposer element is depicted as part of a chip/interposer assembly. One skilled in the art will recognize that it is not required for the interposer element to be affixed to a chip before the solder balls are transferred to the conductive posts. While the present embodiment describes the transfer of solder balls to conductive posts, one skilled in the art will recognize that the transfer process can be used to affix solder balls directly to contacts exposed on the surface of the second microelectronic element.

Figure 4A:
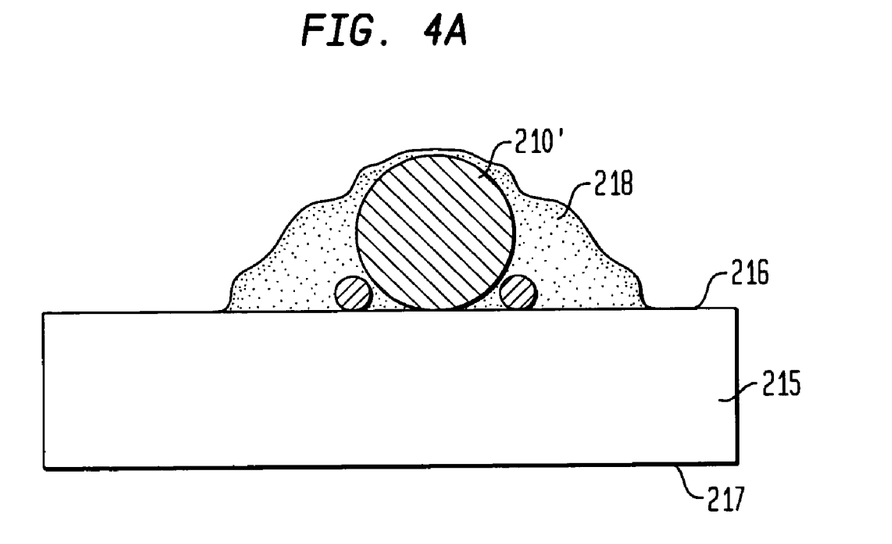
FIGS. 4A-4F is an illustration of the process used to form solder balls on a transfer substrate and the transfer of those solder balls from the transfer substrate to the conductive posts.

As shown in FIG. 4A, a solder sphere 210 is formed on a transfer substrate 215. The transfer substrate 215 is preferably a glass substrate. The transfer substrate has opposed faces 216 and 217. Solder paste 218 (consisting of solder particles that do not wet the glass transfer substrate 215 and a flux that does wet the glass transfer substrate 215) is deposited on the transfer substrate 215 and reflowed to form the large solder sphere 210'.

Figure 4B:
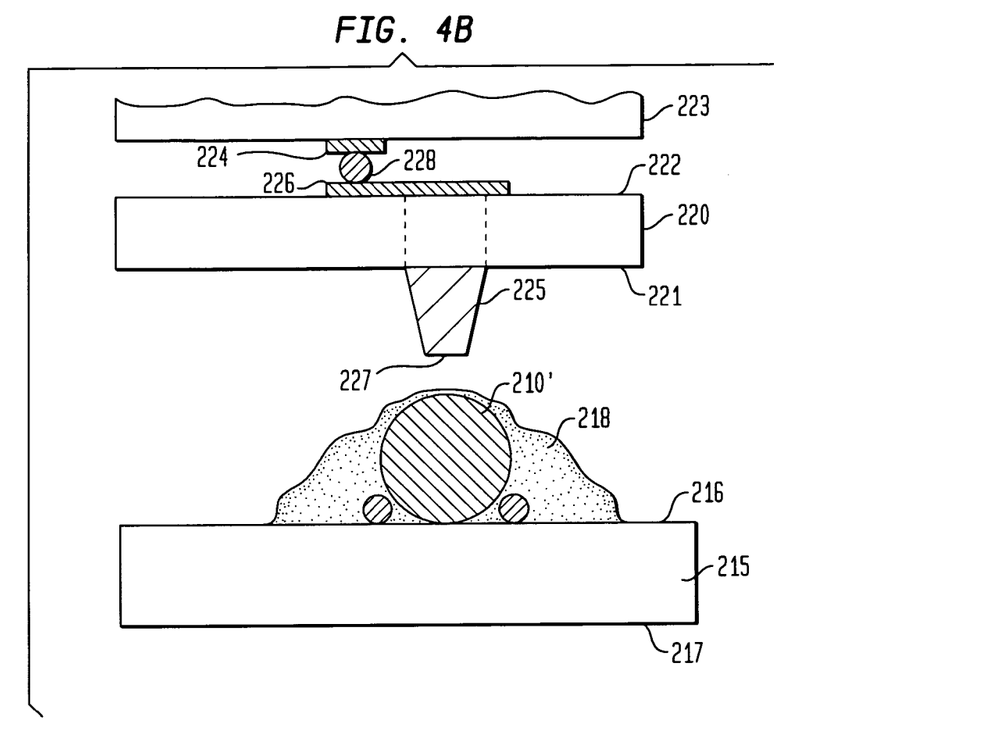

Referring to FIG. 4B, a receiving substrate 220, having at least one conductive post 225, is aligned with the solder sphere 210'. One example of a receiving substrate 220 having conductive posts 225 is the interposer element previously described. An example of an interposer element is the Socketstrate® pin substrate. (Socketstrate® is a trademark owned by Tessera, Inc.) Connection components made of a dielectric material and having conductive posts extending therefrom are disclosed in commonly assigned Provisional Patent Application No. 60/583,108 entitled "Structure with Spherical Contact Pins filed on Jun. 25, 2004; Provisional Patent Application No. 60/583,109 entitled "Components with Posts and Pads" filed on Jun. 25, 2004; and U.S. Patent Application No. 60/583,066 entitled, "Microelectronic Packages and Method Therefor," filed on Jun. 25, 2004, which are incorporated by reference herein. The Socketstrate® substrate has a forward face 221 and a back face 222. The forward face 221 has the conductive posts 225 extending therefrom. The back face 222 has affixed thereto a first microelectronic element in the form of a semiconductor chip 223. As previously described, the semiconductor chip 223 is electrically connected to the conductive posts 230 via contact pad 224, trace 226 and conductive supports 228. As previously noted, it is advantageous if the Socketstrate® element is at least somewhat flexible and that the conductive supports 228 serve a support function in addition to an interconnect function. With regard to their support function, it is advantageous if the conductive supports 228 are offset from the conductive posts 225 in the Socketstrate® substrate.

Figure 4C:
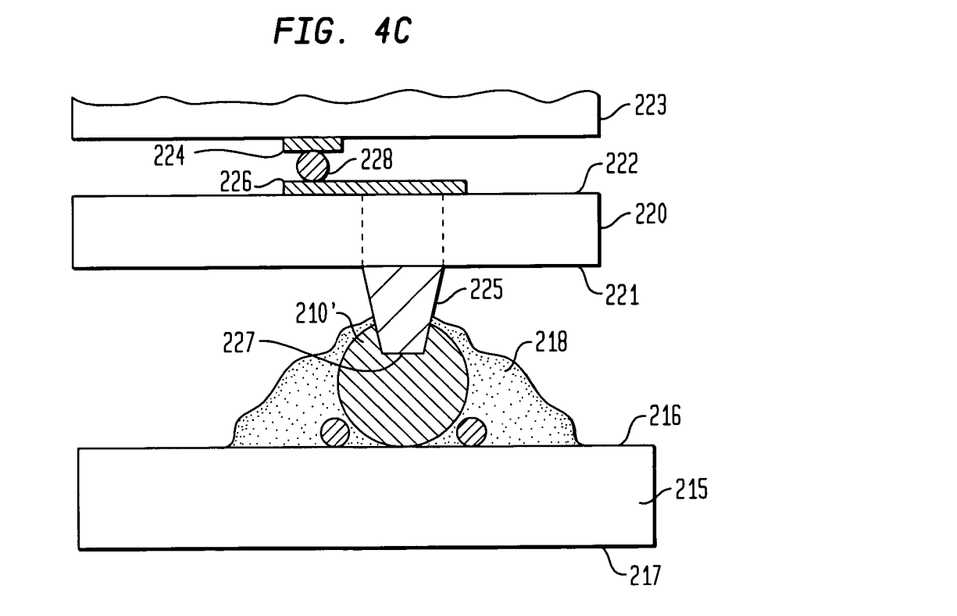

The conductive post 225 has a head 227 and a tapered configuration. Referring to FIG. 4C, the conductive post 225 is brought into contact with solder sphere 210'. In operation the solder sphere 210' is transferred onto the post head 227 of the conductive post 225. It is advantageous if the conductive post 225 is essentially enveloped by the solder sphere 210'. The solder sphere is then caused to reflow causing the solder in solder sphere 210' to reflow. Since the solder particles in the solder sphere 210' will wet the conductive post 225, the solder sphere will dewet (i.e. unattach) from the transfer substrate 215.

Figure 4D:
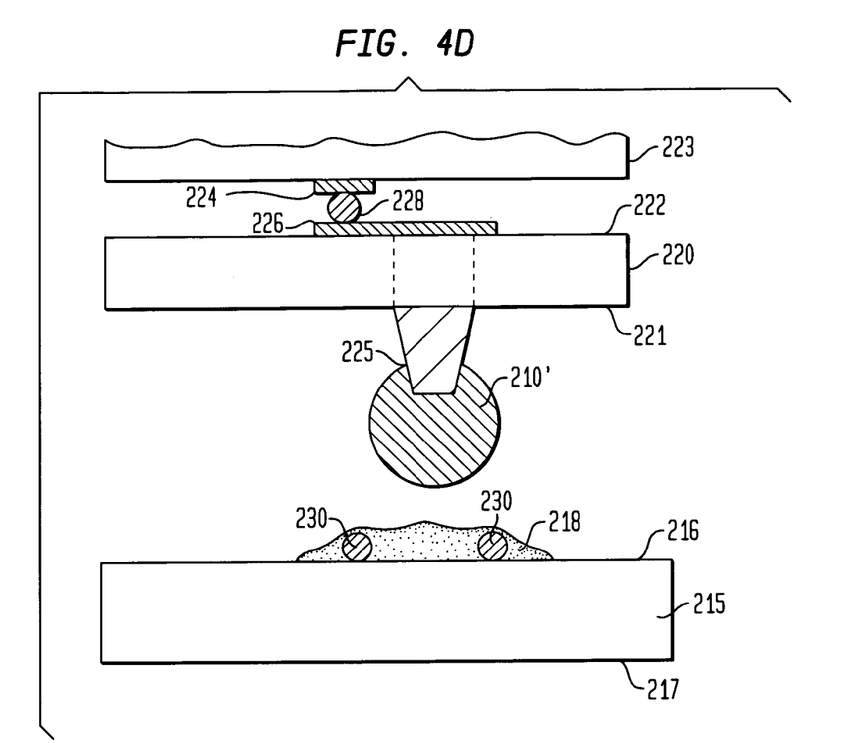

Referring to FIG. 4D, the transfer substrate 215 is separated from the receiving substrate 220. Upon complete separation, residual solder satellites 230 remain with the transfer substrate 215 while solder ball 210' remains attached to conductive post 225.

Figure 4E:
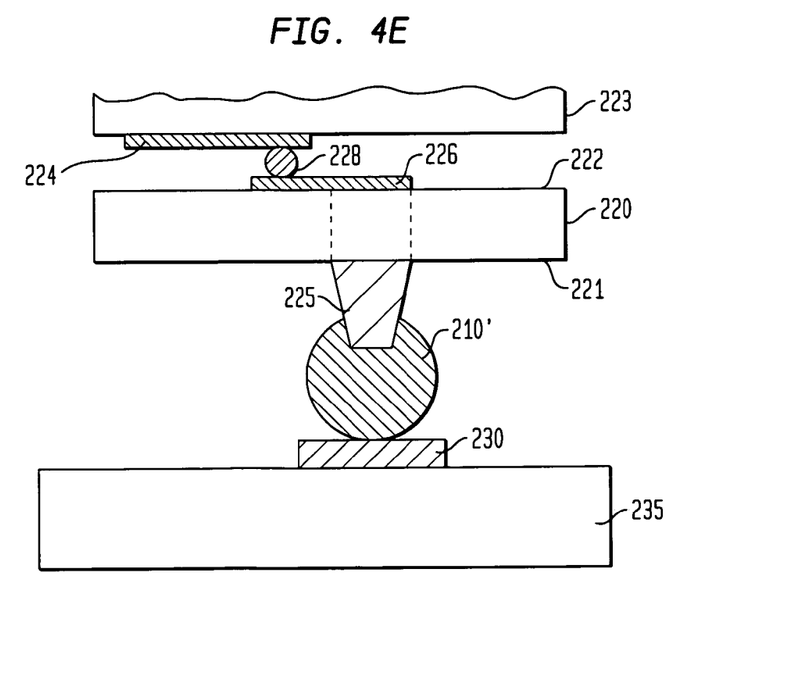

Referring to FIG. 4E, the solder balls 210', attached to the conductive posts 225, are aligned with and placed into contact with contact pads 230 on second receiving substrate 235. In this embodiment of the present invention, the second receiving substrate 235 is also an integrated circuit chip. As illustrated in FIG. 4E, the first chip 223 is smaller than the second chip 235. The solder sphere 210' is then subjected to conditions that, again, cause it to reflow, causing the solder to adhere to the contact pad 230.

Figure 4F:
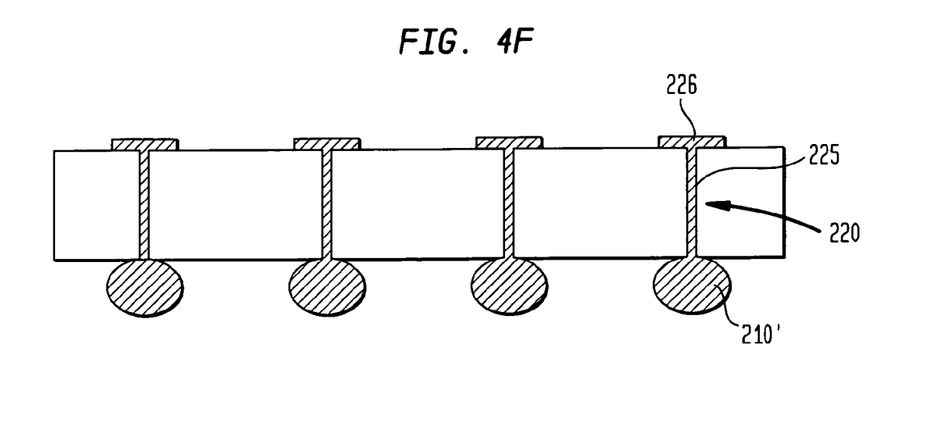

In yet another embodiment, solder paste is formed on the transfer substrate and the contact posts are brought into contact with the solder paste prior to reflow. The assembly is then subjected to solder reflow conditions. The solder balls coalesce around the conductive posts, because the conductive posts are made of a solder-wettable material while the transfer substrate itself is not solder wettable. Once the solder is reflowed, and the solder balls coalesce, the Socketstrate® substrate is separated from the transfer substrate. Referring to FIG. 4F, solder balls 210' separate with the Socketstrate® substrate 220. Conductive posts 225 interconnect conductive traces 226 with solder balls 210'.

In the above described embodiment, it is preferred, but not required, that the Socketstrate® substrate be attached to a first chip 223 before being attached to the second receiving substrate 235. As previously noted, the chip 223 is electrically interconnected to the conductive posts on the Socketstrate® element through the interconnect structure provided by the Socketstrate® substrate.

Embodiments of the present invention contemplate a stacked die structure in which at least two chips are electrically interconnected in the above-described manner. For example, in the device illustrated in FIG. 2 the stacked structure 100 is a memory chip 110 supported by and electrically interconnected to a logic chip 140.

Several advantages flow from using an intermediate substrate, such as the Socketstrate® interposer element described above, in the stacked chip architecture. Specifically, the small chip affixed to the interposer element can be fully tested. Such testing is difficult for chips packaged in a flip chip arrangement. Thus, in the present invention, the chip with interposer attached is fully tested and only chips that pass the electrical tests are interconnected with a second chip to form the assembly. Also, as observed above, the interposer element, due to its flexibility, adapts to nonuniformities in contact position and stresses on the contacts due to mismatch in the coefficient of thermal expansion of the materials in the chips that make up the assembly that can compromise contact integrity.

Figure 5:
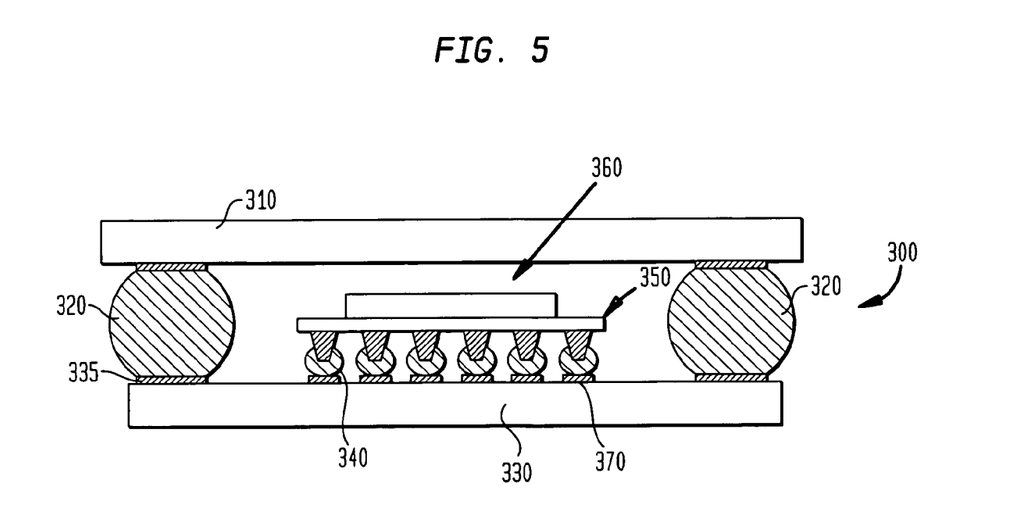
FIG. 5 is a cross-section of a stacked chip package according to a second embodiment of the present invention.

Another embodiment of the present invention is illustrated in FIG. 5. FIG. 5 is a stacked chip structure 300 attached to a printed circuit board 310. The stacked chip structure 300 is attached to the printed circuit board via solder spheres 320. The solder spheres 320 are attached and electrically interconnected to logic chip 330 via contact pads 335. A plurality of such contact pads are formed on logic chip 330 as an array. In the embodiment depicted in FIG. 5, the array is a series of solder-wettable contact pads 335. The contact pads have a size and placement that facilitate contact with both the larger contact spheres 320 that interconnect the logic chip 330 with the printed circuit board 310 and the smaller contact spheres 340 that interconnect the memory chip 360 (through interposer element 350) with the logic chip 330.

Many variations and modifications to the exemplary embodiment illustrated in FIG. 5 are possible. For example, the large solder spheres 320 could be replaced by a pin grid array or other suitable interconnect structure.

It is particularly advantageous to form the stacked structure depicted in FIG. 5 with an interposer element having conductive posts 370. In the manufacture of such a structure, a flexible interposer element 350 ensures the function and reliability of the final product. Again, the interposer element 350 allows alignment to be achieved even if there is a mismatch in pitch or placement between the contact array formed on logic chip 330 and the contacts on the memory chip 360 or the contacts 311 on the printed circuit board 310. The interposer element 350 also ensures interconnection even if the array of contacts 335 (to which interposer 350 connects) is not completely planar. As noted above, contact arrays can be less that perfectly coplanar due to variations in the manufacturing process. Also, the interposer element ensures that electrical interconnection between the two chips remains even when subjected to the stresses caused by mismatches in the coefficient of thermal expansion of the various materials used to form the stacked structure when the structure is subjected to elevated temperatures.

As previously described, support elements, at least some of which are, preferably, conductive, are interposed between the face of the interposer element opposite the conductive posts, and the chip opposing it. In an alternate embodiment, an anisotropic conductive adhesive is used to bond the chip 360 to the interposer element.

Examples of functional relationships between logic chip 330 and memory chip 360 are described U.S. Pat. No. 6,452,259 B2, which is incorporated by reference herein. For example, logic chip 330 can be a field programmable gate array (FPGA) and memory chip 360 can perform a central processing unit (CPU) function in addition to a memory function. A microelectronic device with two chips having functions distributed in the above-described manner finds use as a controller for controlling devices that are external to the microelectronic device assembly 300. The external devices are controlled by the CPU function disposed on memory chip 360. The FPGA formed on logic chip 330 functions as an interface between the CPU and the external devices. One of the advantages of this distribution of functions is that a dedicated interface circuit on yet another chip is not required.

The structure illustrated in FIG. 5 is particularly advantageous for two chips having the above described functional relationship. This is because logic chip 330 requires both low and high power (which is readily provided through electrical connections from the printed circuit board 310 to which logic chip 330 is electrically connected). Memory chip 360 requires only low power which can be readily supplied through the electrical interconnections between logic chip 330 and memory chip 360.

Therefore, only logic chip 330 needs to withstand high voltages, which are required to write and erase programs to and from the FPGA. As used herein, high voltages are voltages in excess of about five (5) volts. The memory chip 360 is only required to withstand low voltages. As used herein, low voltages are voltages of about five (5) volts or less. Examples of portions of logic arrays that may be formed on logic chip 330 are described in U.S. Pat. No. 6,452,259. These circuits are referred to by way of example and not by way of limitation. The described logic arrays have programmable switches. Switches incorporated into such logic arrays can be fused, anti-fuse, EEPROM (electrically erasable and programmable read-only memory) or flash memory, or SRAM (static random access memory) devices. Another example of a suitable switch device is a ferroelectric memory device.

The above-described circuits and switches therefore are useful if the chip assembly will be used as a controller for controlling external devices. However, the chip assembly is not required to perform this particular function. For example the chip assembly can be used as a general purpose FPGA. Also, there is no requirement that the logic chip 330 function as an FPGA. For example, the functional section on logic chip 330 can be configured to operate as a memory. In this example, a writing section can be formed on memory chip 360 for writing and erasing data on the memory device 330.

Figure 6:
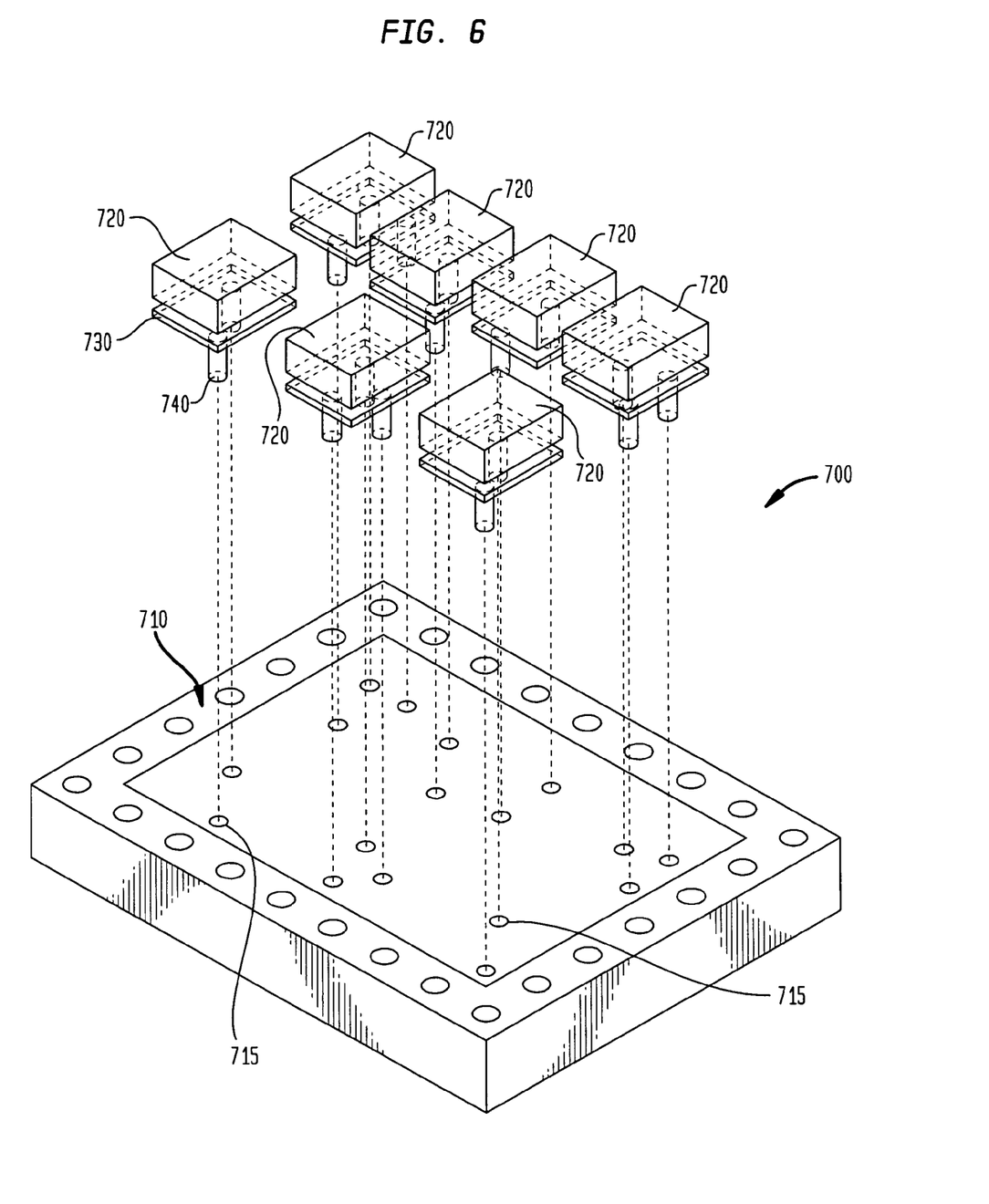
FIG. 6 is an exploded view of a stacked chip package according to a third embodiment of the present invention.

As illustrated in FIG. 6, the present invention is not limited to a single first chip being electrically interconnected to a second chip. In this embodiment, the stacked chip device, 700 has a larger first chip 710 on which are mounted a plurality of smaller second chips 720. Each second chip is electrically interconnected to an interposer element 730 having a plurality of conductive posts 740. The conductive posts are aligned with contacts 715 on the first chip 710.

Figure 7:
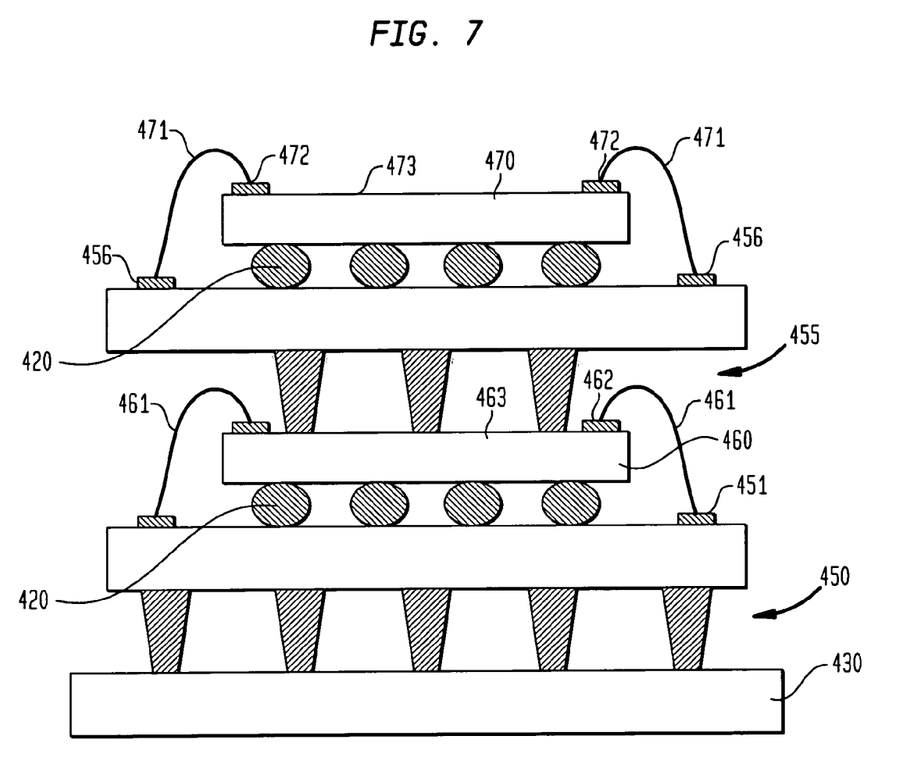
FIG. 7 is a cross-section of a stacked chip package according to a third embodiment of the present invention.

As illustrated in FIG. 7, more than two chips can make up the microelectronic package of the present invention. In the depicted embodiment, first interposer element 450 interconnects small chip 460 with large chip 430. Second interposer 455 element interconnects third chip 470 with first small chip 460. Support elements 420 are interposed between first interposer element 450 and first small chip 460 and between second interposer element 455 and third chip 470. Third chip 470 is electrically connected to second interposer element 455 via wires 471 that interconnect contacts 472 on the contact face 473 of chip 470 with traces 456 on interposer element 455. First chip 460 is electrically connected to first interposer element 450 via wires 461 that interconnect contacts 462 on the contact face 463 of chip 460.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A microelectronic device comprising:
first and second microelectronic elements;
said first microelectronic element having a plurality of frustoconical conductive posts extending from the direction of a first face of said first microelectronic element, at least some of said frustoconical conductive posts being electrically interconnected with said first microelectronic element; and
said second microelectronic element having a first face with contacts said contacts being electrically connected with said second microelectronic element, said first face of said first microelectronic element facing toward said first face of said second microelectronic element and said frustoconical conductive posts extending toward said contacts on said first face of said second microelectronic element, wherein at least some of said frustoconical conductive posts are electrically connected to at least some of said contacts.

2. A microelectronic device comprising:
first and second microelectronic elements; said first microelectronic element having a plurality of conductive posts extending from the direction of a first face of said first microelectronic element, at least some of said conductive posts being electrically interconnected with said first microelectronic element wherein said first microelectronic element is a combination including a body having a front surface and an interposer element overlying said front surface of said body, said interposer having an inner surface facing toward said front surface of said body and an outer surface facing away from said front surface of said body and defining said first face of said first microelectronic element, said conductive posts extending from said outer surface of said interposer; and
said second, microelectronic element having a first face with contacts said contacts being electrically connected with said second microelectronic element, said first face of said first microelectronic element facing toward said first face of said second microelectronic element and said conductive posts extending toward said contacts on said first face of said second microelectronic element, wherein at least some of said conductive posts are electrically connected to at least some of said contacts.

3. The microelectronic device of claim 2 wherein said first microelectronic element has contacts on said body and an interconnect structure that electrically interconnects said body with said contacts.

4. The microelectronic device of claim 3 wherein said first microelectronic element has an interconnect structure that electrically interconnects said body contacts with said conductive posts.

5. The microelectronic device of claim 4 further comprising a plurality of support elements interposed between said body and said inner face of said interposer element, at least some of said plurality of support elements being offset from said conductive posts.

6. The microelectronic device of claim 5 wherein at least some of said support elements are electrically conductive, said conductive support elements electrically interconnecting at least some of said contacts of said body with at least some of said conductive posts.

7. The microelectronic device of claim 6 wherein at least some of said electrically conductive support elements are immediately adjacent conductive posts in a reference plane defined by said interposer.

8. The microelectronic device of claim 4 wherein said interconnect structure of said interposer element is comprised of conductive traces exposed on said inner face of said interposer.

9. The microelectronic device of claim 4, wherein said interconnect structure of said interposer element is comprised of conductive traces formed on said inner face of said interposer element.

10. The microelectronic device of claim 3 wherein said contacts on said body and on said second microelectronic element are each configured in a grid array that faces toward said interposer.

11. The microelectronic device of claim 2 wherein the body is an integrated circuit device.

12. A microelectronic device comprising:
first and second microelectronic elements;
said first microelectronic element having a plurality of conductive posts extending from the direction of a first face of said first microelectronic element, at least some of said conductive posts being electrically interconnected with said first microelectronic element;
said second microelectronic element having a first face with contacts said contacts being electrically connected with said second microelectronic element, said first face of said first microelectronic element facing toward said first face of said second microelectronic element and said conductive posts extending toward said contacts on said first face of said second microelectronic element, wherein at least some of said conductive posts are electrically connected to at least some of said contacts;
wherein said microelectronic device is configured to control an external device and wherein said second microelectronic element has a first functional section and said first microelectronic element has a second functional section, said first functional section being a field programmable functional section, the functions of which are changed in response to said second functional section and said external device.

13. The microelectronic device of claim 12 wherein said second functional section performs a writing function for programming the first functional section.

14. The microelectronic device of claim 13 wherein power from a power source is received by said second microelectronic element and further provided to said first microelectronic element.

15. The microelectronic device of claim 14 wherein said power received by said second microelectronic element is both high voltage power and low voltage power and said power provided to said first microelectronic element is low voltage power.

16. The microelectronic device of claim 14 wherein said power received by said second microelectronic element is high voltage and said power provided to said first microelectronic element is also high voltage.

17. The microelectronic device of claim 2 further comprising at least one additional microelectronic element supported by and electrically interconnected with one of said first and second microelectronic elements.

* * * * *